(12) United States Patent
Lin

(10) Patent No.: US 7,888,999 B2
(45) Date of Patent: Feb. 15, 2011

(54) PREMIUM POWER AMPLIFIER

(75) Inventor: Hsien-Lu Lin, Hemei Township (TW)

(73) Assignee: Loopcomm Technology Inc. (TW)

(*) Notice: Subject to any disclaimer, the term of this patent is extended or adjusted under 35 U.S.C. 154(b) by 394 days.

(21) Appl. No.: 12/169,774

(22) Filed: Jul. 9, 2008

(65) Prior Publication Data

US 2010/0007411 A1    Jan. 14, 2010

(51) Int. Cl.
*H03F 3/68* (2006.01)
(52) U.S. Cl. .................... 330/124 R; 330/295
(58) Field of Classification Search .............. 330/124 R, 330/295, 84, 126
See application file for complete search history.

(56) References Cited

U.S. PATENT DOCUMENTS 6,806,768 B2 * 10/2004 Klaren et al. ......... 330/124 R
7,230,484 B2 * 6/2007 Hirtzlin et al. ........ 330/124 R
7,362,170 B2 * 4/2008 Louis .................... 330/124 R

* cited by examiner

*Primary Examiner*—Henry K Choe
(74) *Attorney, Agent, or Firm*—Schmeiser, Olsen & Watts, LLP

(57) ABSTRACT

The present invention discloses a premium power amplifier applied in an antenna module, and the premium power amplifier includes a first transmission unit, having two symmetrical and identical first arc-shaped circuits, two secondary power amplifiers connected in parallel with each other, and a second transmission unit having two symmetrical and identical second arc-shaped circuits, in which those components above are installed between a power amplifier and an output terminal of the antenna. So that the output power of the antenna can be improved greatly, and the effective transmission distance can be extended.

8 Claims, 3 Drawing Sheets

PREMIUM POWER AMPLIFIER

FIELD OF THE INVENTION

The present invention relates to a premium power amplifier, and more particularly to a premium power amplifier used in an access point (AP)/bridge.

BACKGROUND OF THE INVENTION

In recent years, wireless networks products and applications bloom, and wireless networks become an indispensable part of our life, since wireless communications via mobile phones and wireless networks are developed rapidly, and increasingly more users own a notebook computer with a built-in network card. In the present digital era, the prosperity of a modern city is measured by the popularity of wireless networks, and eventually wireless networks can be accessed everywhere including homes, offices, cafés, and parks, and wireless network signals exist almost everywhere in a cosmopolitan area. However, the signal intensity of wireless networks is inversely proportional to the propagation distance, and thus the larger the wireless signal transmission power, the farther is the transmission distance (or the better is the transmission rate within the same distance range.)

In a traditional access point (AP)/bridge, the wireless signal transmitting antenna module has a power amplifier installed at the front of an input terminal, such that the output power is approximately 13±1 dBm, and the effective transmission distance is approximately tens of meters only. Obviously, there is an urgent need for a simple and easy device to improve the output power and increase the effective wireless transmission distance to meet user requirements.

SUMMARY OF THE INVENTION

In view of the foregoing shortcomings of the prior art, the inventor of the present invention based on years of experience in the related field to conduct extensive researches and experiments, and finally developed a premium power amplifier to overcome the shortcomings of the prior art.

Therefore, it is a primary objective of the present invention to provide a power amplifier capable of increasing the output power of a wireless signal.

To achieve the foregoing objective, the present invention provides a premium power amplifier, comprising: a first transmission unit, electrically coupled to a primary power amplifier by a first transmission circuit, and having two symmetric and identical first arc-shaped circuits with a wire length of 1000 mil to 1100 mil, preferably 1040 mil, a wire width of 11 mil to 12.6 mil, preferably 12 mil, and a thickness of 0.5 mil to 0.8 mil, preferably 0.7 mil; two secondary power amplifiers, connected in parallel with each other and electrically coupled to the first transmission unit by a second transmission circuit; a second transmission unit, electrically and respectively coupled to the secondary power amplifiers by two third transmission circuits; and a fourth transmission circuit electrically coupled to an antenna. The second transmission unit includes two symmetrical and identical second arc-shaped circuits with a wire length of 1000 mil to 1100 mil, preferably 1040 mil, a wire width of 11 mil to 12.6 mil, preferably 12 mil, and a thickness of 0.5 mil to 0.8 mil, preferably 0.7 mil. Two partition grooves are disposed on a side proximate to the first transmission circuit, the first arc-shaped circuits, the second transmission circuits, the third transmission circuits, the second arc-shaped circuits and the fourth transmission circuit. The two partition grooves, each has a width of 9 mil to 12 mil, preferably 10 mil. A first insulating board provided for carrying the foregoing elements comes with a thickness of 5 mil to 8 mil, preferably 6 mil. A ground board provided for carrying the first insulating board comes with a thickness of 1.2 mil to 1.5 mil, preferably 1.4 mil.

The first transmission circuit, the first arc-shaped circuits, the second transmission circuits, the third transmission circuits, the second arc-shaped circuits and the fourth transmission circuit are made of copper. The premium power amplifier is installed at an access point/bridge. The first transmission unit, the second transmission circuits, the secondary power amplifiers, the third transmission circuits and the second transmission unit are installed sequentially along a central partition line extended linearly from the first transmission circuit to the fourth transmission circuit.

The premium power amplifier of the invention further comprises a second insulating board, a power supply board, a third insulating board and a lower conducting board, and the second insulating board carries the ground board, and the power supply board carries the second insulating board, and the third insulating board carries the power supply board, and the lower conducting board carries the third insulating board. The second insulating board comes with a thickness of 47 mil to 50 mil, preferably 48 mil; the power supply board comes with a thickness of 1.2 mil to 1.5 mil, preferably 1.4 mil; the third insulating board comes with a thickness of 5 mil to 8 mil, preferably 6 mil; and the lower conducting board comes with a thickness of 0.5 mil to 0.8 mil, preferably 0.7 mil.

DESCRIPTION OF THE PREFERRED EMBODIMENT

The above and other objects, features and advantages of the present invention will become apparent from the following detailed description taken with the accompanying drawing.

Figure 1:
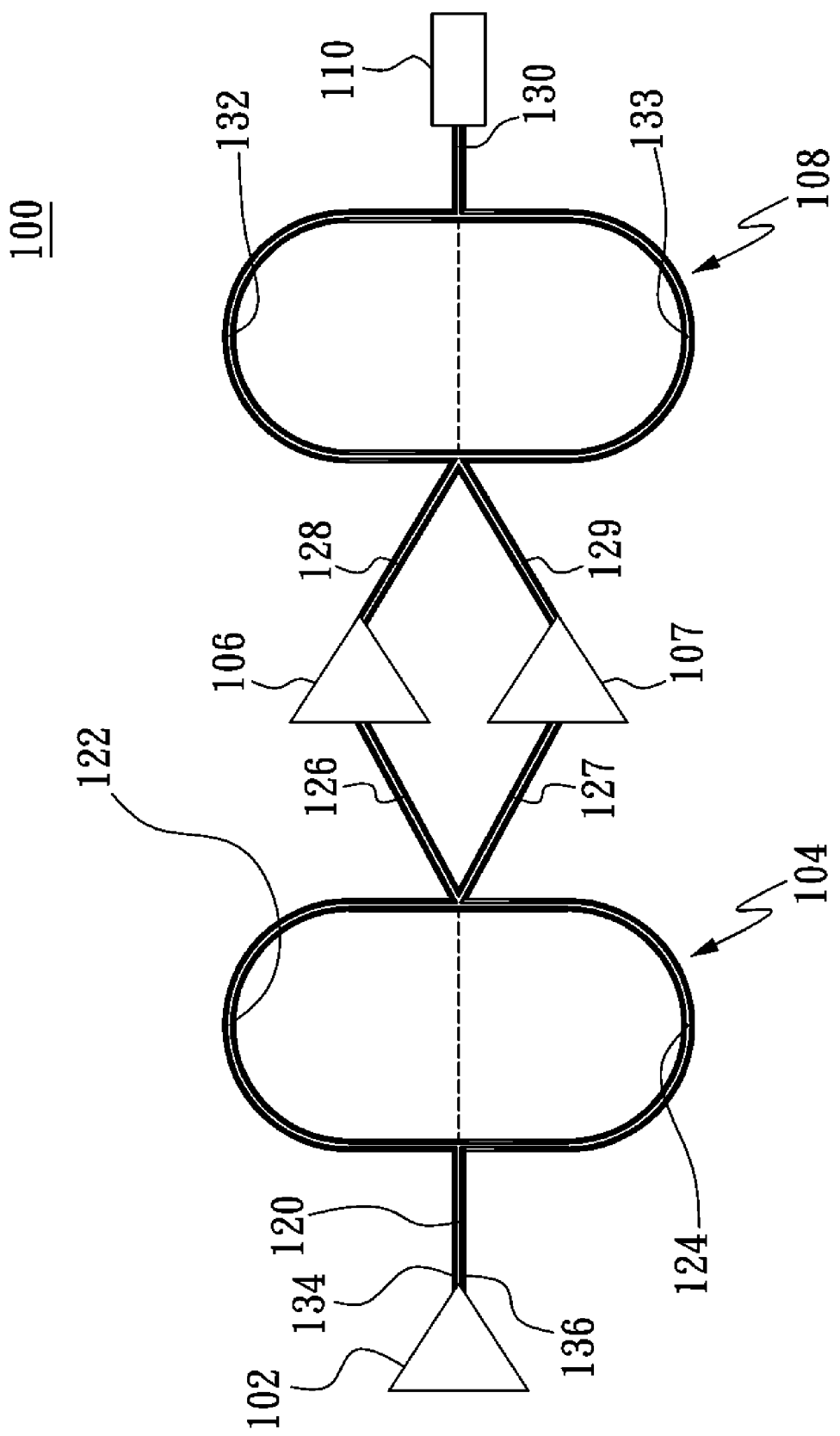
FIG. 1 shows a functional block diagram of the present invention.

With reference to FIG. 1 for a functional block diagram of the present invention, a premium power amplifier 100 comprises a primary power amplifier 102, a first transmission unit 104, two secondary power amplifiers 106, 107, a second transmission unit 108 and an antenna 110. The first transmission unit 104 is electrically coupled to the primary power amplifier 102 by a first transmission circuit 120, and the first transmission unit 104 includes two symmetrical and identical first arc-shaped circuits 122, 124. The two secondary power amplifiers 106, 107 are connected in parallel with each other, and are electrically and respectively coupled to the first transmission unit 104 through a second transmission circuit 126, 127. The second transmission unit 108 is electrically and respectively coupled to the secondary power amplifiers 106, 107 through two third transmission circuits 128, 129. The second transmission unit 108 includes two symmetrical and identical second arc-shaped circuits 132, 133. The second transmission unit 108 is electrically coupled to the antenna 110 by a fourth transmission circuit 130. Two partition grooves 134, 136 are disposed on a side proximate to the first transmission circuit 120, the first arc-shaped circuits 122, 124, the second transmission circuits 126, 127, the third transmission circuits 128, 129, the second arc-shaped circuits 132, 133 and the fourth transmission circuit 130. In FIG. 1, the first transmission unit 104, the second transmission circuits 126, 127, the secondary power amplifiers 106, 107, the third transmission circuits 128, 129 and the second transmission unit 108 are installed sequentially along a central partition line extended linearly from the first transmission circuit 120 to the fourth transmission circuit 130.

Figure 2:
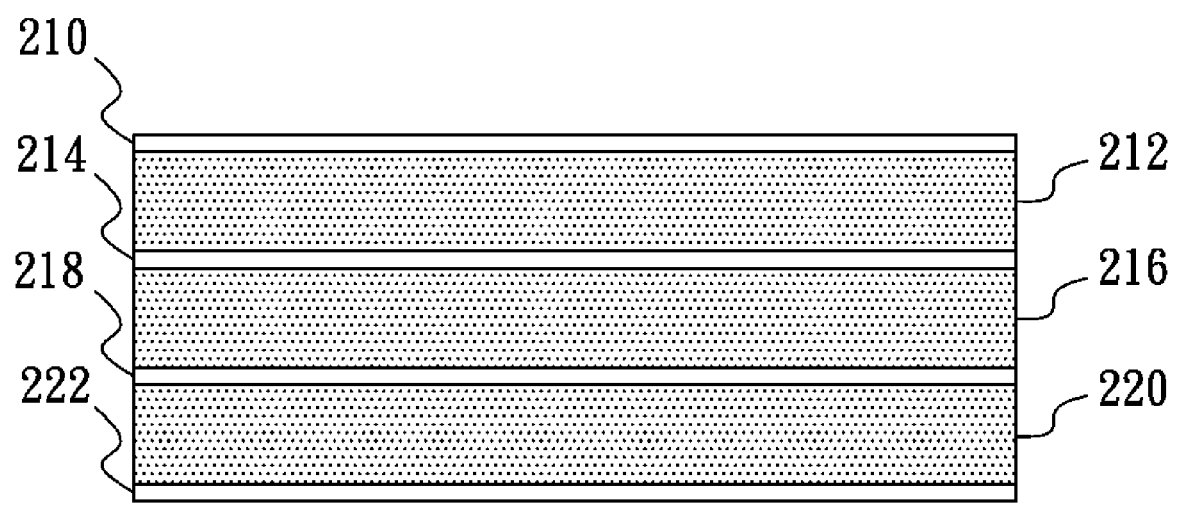
FIG. 2 shows a layer structure of the present invention.

With reference to FIG. 2 for a layer structure of the present invention, the layer structure comprises: an upper conducting board 210, a first insulating board 212, a ground board 214, a second insulating board 216, a power supply board 218, a third insulating board 220 and a lower conducting board 222. The upper conducting board 210 comprises: the first transmission circuit 120, the first arc-shaped circuits 122, 124, the second transmission circuits 126, 127, the third transmission circuits 128, 129, the second arc-shaped circuits 132, 133 and the fourth transmission circuit 130 as shown in FIG. 1. The upper conducting board 210 is made of copper and has a thickness of 0.5 mil to 0.8 mil, preferably 0.7 mil. The first insulating board 212 is made of polypropylene (PP) for carrying the elements shown in FIG. 1, and the first insulating board 212 comes with a thickness of 5 mil to 8 mil, preferably 6 mil. The ground board 214 is made of copper and has a thickness of 1.2 mil to 1.5 mil, preferably 1.4 mil. The second insulating board 216 is made of fiberglass, and has a thickness of 47 mil to 50 mil, preferably 48 mil. The power supply board 218 is made of copper and has a thickness of 1.2 mil to 1.5 mil, preferably 1.4 mil. The third insulating board 220 is made of polypropylene (PP) and has a thickness of 5 mil to 8 mil, preferably 6 mil. The lower conducting board 222 is made of copper and has a thickness of 0.5 mil to 0.8 mil, preferably 0.7 mil.

Figure 3:
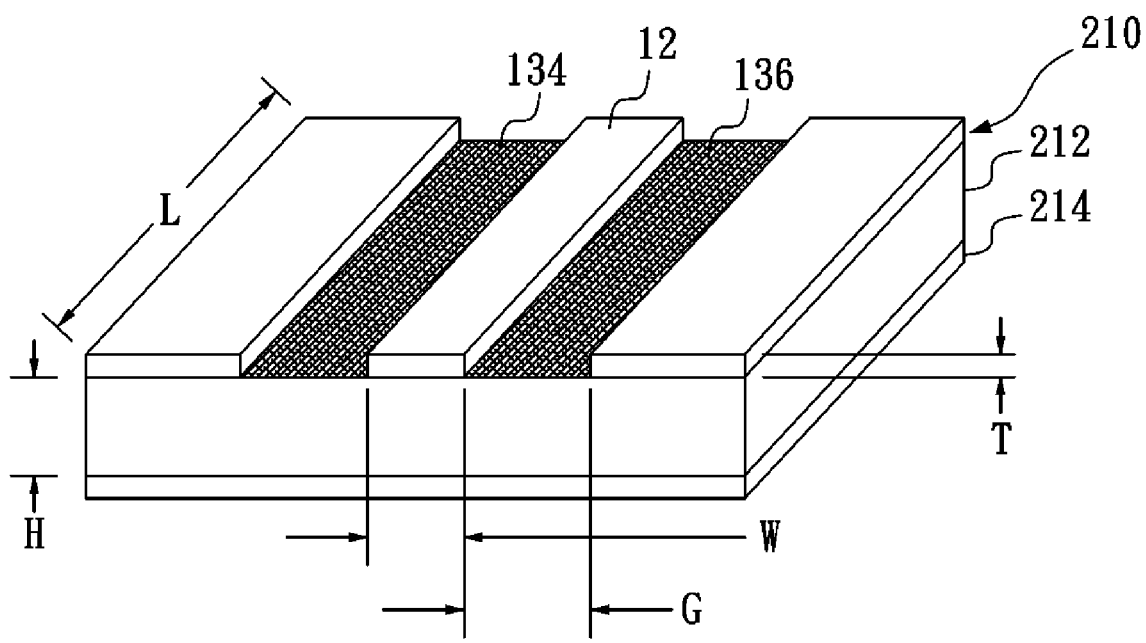
FIG. 3 shows a perspective cross-sectional view of a circuit of the present invention.

With reference to FIG. 3 for a perspective cross-sectional view of a circuit of the present invention, the related thickness of the upper conducting board 210, the first insulating board 212 and the ground board 214 of FIG. 2 is illustrated, wherein H stands for the thickness of the first insulating board 212 and T stands for the thickness of the upper conducting board 210. With reference to FIG. 3 together with FIG. 1, the two partition grooves 134, 136 are disposed on both sides of the circuit, and the width G of the two partition grooves ranges from 9 mil to 12 mil and preferably equals to 10 mil. The first and second arc-shaped circuits come with a wire length L of 1000 mil to 1100 mil, preferably 1040 mil and a wire width W of 11 mil to 12.6 mil, preferably 12 mil.

The first transmission circuit 120, the first transmission unit 104, the secondary power amplifiers 106, 107, the second transmission unit 108 and the fourth transmission circuit 130 of the invention are added sequentially between a power amplifier and an output terminal of an antenna for increasing the output power of the antenna from 13±1 dBm to 28.5±1 dBm, and the effective transmission distance from the original tens of meters to thousands of meters.

While the invention has been described by means of specific embodiments, numerous modifications and variations could be made thereto by those skilled in the art without departing from the scope and spirit of the invention set forth in the claims.

What is claimed is:

1. A premium power amplifier, comprising:
    a first transmission unit, electrically coupled to a primary power amplifier by a first transmission circuit, and having two symmetric and identical first arc-shaped circuits with a wire length of 1000 mil to 1100 mil, a wire width of 11 mil to 12.6 mil and a thickness of 0.5 mil to 0.8 mil;
    two secondary power amplifiers, connected in parallel with each other, and electrically coupled to the first transmission unit by a second transmission circuit;
    a second transmission unit, electrically coupled to the secondary power amplifiers through two third transmission circuits, and electrically coupled to an antenna by a fourth transmission circuit, and the second transmission unit having two symmetrical and identical second arc-shaped circuits with a wire length of 1000 mil to 1100 mil, a wire width of 11 mil to 12.6 mil, and a thickness of 0.5 mil to 0.8 mil;
    two partition grooves, disposed along a side proximate to the first transmission circuit, the first arc-shaped circuit, the second transmission circuit, the third transmission circuit, the second arc-shaped circuit and the fourth transmission circuit, and the two partition grooves having a width of 9 mil to 12 mil;
    a first insulating board, for carrying the foregoing elements, and the first insulating board having a thickness of 5 mil to 8 mil; and
    a ground board, for carrying the first insulating board, and the ground board having a thickness of 1.2 mil to 1.5 mil.

2. The premium power amplifier of claim 1, wherein the first transmission circuit, the first arc-shaped circuits, the second transmission circuits, the third transmission circuits, the second arc-shaped circuits and the fourth transmission circuit are made of copper.

3. The premium power amplifier of claim 1, further comprising a second insulating board, a power supply board, a third insulating board and a lower conducting board, and the second insulating board carries the ground board, and the power supply board carries the second insulating board, and the third insulating board carries the power supply board, and the lower conducting board carries the third insulating board.

4. The premium power amplifier of claim 3, wherein the second insulating board has a thickness of 47 mil to 50 mil, and the power supply board has a thickness of 1.2 mil to 1.5 mil, and the third insulating board has a thickness of 5 mil to 8 mil, and the lower conducting board has a thickness of 0.5 mil to 0.8 mil.

5. The premium power amplifier of claim 4, wherein the second insulating board has a thickness of 48 mil, and the power supply board has the thickness of 1.4 mil, and the third insulating board has a thickness of 6 mil, and the lower conducting board has a thickness of 0.7 mil.

6. The premium power amplifier of claim 1, wherein the premium power amplifier is installed at an access point/bridge.

7. The premium power amplifier of claim 1, wherein the first and second arc-shaped circuits have a wire length of 1040 mil, a wire width of 12 mil, and a thickness of 0.7 mil; the partition grooves have a width of 10 mil; the first insulating board has a thickness of 6 mil; and the ground board has a thickness of 1.4 mil.

8. The premium power amplifier of claim 1, wherein the first transmission unit, the second transmission circuits, the secondary power amplifiers, the third transmission circuits and the second transmission unit are installed sequentially along a central partition line extended linearly from the first transmission circuit to the fourth transmission circuit.

* * * * *